United States Patent [19]
Pass

[11] Patent Number: 5,343,166
[45] Date of Patent: Aug. 30, 1994

[54] EFFICIENT HIGH FIDELITY AUDIO POWER AMPLIFIER

[75] Inventor: Nelson S. Pass, Foresthill, Calif.

[73] Assignee: Pass Laboratories, Inc., Foresthill, Calif.

[21] Appl. No.: 112,430

[22] Filed: Aug. 26, 1993

[51] Int. Cl.$^5$ ............................................. H03F 3/26
[52] U.S. Cl. ................................. 330/264; 330/267
[58] Field of Search ............... 330/263, 264, 267, 269, 330/273, 277, 310

[56] References Cited

U.S. PATENT DOCUMENTS

| | | | |
|---|---|---|---|
| 3,995,228 | 11/1976 | Pass | 330/13 |
| 4,107,619 | 8/1978 | Pass | 330/255 |
| 4,115,739 | 9/1978 | Sano et al. | 330/263 |
| 4,206,419 | 6/1980 | Yokoyama | 330/263 |
| 4,959,623 | 9/1990 | Khoury | 330/264 X |
| 5,218,321 | 6/1993 | Jost | 330/267 X |

*Primary Examiner*—Steven Mottola
*Attorney, Agent, or Firm*—Schneck & McHugh

[57] ABSTRACT

A power amplifier circuit having a cascode transistor configuration with at least one gain transistor biased for Class-A or Class-AB operation and at least one cascode transistor, and having at least one isolated high impedance current source connected across the gain transistor(s) to provide an alternate path for bias current other than through the cascode transistor(s). In a complementary symmetry embodiment of the amplifier, a bias voltage across the gates of the complementary gain transistors ensures Class-A (or -AB) operation, while either a single current source connected across both gain transistors or a pair of current sources, each connected across one gain transistor, provides the alternate bias current path. In a single-ended embodiment of the amplifier, a current sink to one of the power supply terminals assures forward bias for Class-A (or -AB) operation, and a single current source is connected across the sole gain transistor. The cascode configuration can employ either a common drain or a common source connection for the gain transistor(s). The current source(s) reduce bias current through the cascode transistor(s) and thereby reduce power dissipation as the cascode transistor(s) holds the voltage drop across the gain transistor(s) relatively constant.

11 Claims, 4 Drawing Sheets

EFFICIENT HIGH FIDELITY AUDIO POWER AMPLIFIER

TECHNICAL FIELD

The present invention relates to cascode transistor amplifier circuits biased for class-A or class-AB operation, especially adapted for high fidelity (linear, low distortion) audio signal amplification, and in particular relates to power amplifier circuit configurations which reduce power dissipation for efficient operation.

BACKGROUND ART

Class-A or highly biased class-AB operation of power amplifiers is desirable for audio signal amplification because it eliminates or reduces crossover distortion and improves the linearity of a power output stage. In a class-A amplifier, the bias and alternating input signal applied to the input electrode (gate or base) of a transistor amplifying element is such that current flows through the output electrodes (source and drain, or emitter and collector) at all times. In Class-AB operation, the bias is such that current flows for more than half but less than the entire input cycle. In Class-B operation, output current flows only during the positive (or negative) half cycle and does not flow through the transistor during the opposite half cycle, so that the transistor regularly switches on and off, causing distortion. However, while the fidelity is improved with Class-A or Class-AB operation, it also has a disadvantage that it is very inefficient, resulting from its normally high idle current. For example, a conventional push-pull complementary output stage operated in Class-A mode will typically idle at more than twice its maximum continuous output rating.

Several techniques have previously been used to reduce the power dissipation in highly biased output stages. In U.S. Pat. No. 3,995,228, an amplifier with a complementary-symmetry emitter-follower output stage is provided with an active bias circuit in place of a constant voltage generator in order to continuously adjust the bias voltage in response to the voltage level at the output mode to maintain forward bias on both output transistors at all times under normal signal conditions. The active bias circuit produces as little increase in the required forward bias as possible for a given current increase, and allows the bias across the "unused" output transistor in the complementary pair to decrease, although not to the point where the transistor would shut off, thus saving power. The active bias circuit includes a pair of $V_{BE}$ multipliers with a shared voltage divider resistor therebetween, and also includes a pair of constant voltage sources (diodes) connected between the output node of the amplifier and voltage reference nodes associated with each $V_{BE}$ multiplier.

In U.S. Pat. No. 4,115,739, Sano et al. describe a power amplifier having two amplifier stages and two separate power supplies. A first amplifier stage has an operating point for Class-A operation and drives a load in response to an input signal. A first power supply provides a voltage to the first amplifier stage. The reference point or voltage of the first power supply is floating and is driven by a second amplifier stage. The second amplifier stage has an operating point for Class-B operation and provides the voltage reference for the first power supply at its output node. A second power supply with a fixed reference point (ground) supplies a voltage to the second amplifier stage. Thus, the second power supply is designed to support the full voltage swing of the amplifier, while the smaller first power supply provides only enough voltage to bias the first (output) amplifier stage. The amplifier stages are interconnected so that the Class-B second amplifier stage, fed by the high voltage second power supply, drives the midpoint of the smaller first power supply, which in turn feeds the Class-A output stage. The result is that the high bias of the Class-A output stage does not flow through the high voltage power supply and efficiency is greatly improved. In U.S. Pat. No. 4,206,419, Yokoyama applies a similar technique to an amplifier operated in a common emitter mode with negative feedback. The Sano et al. patent uses emitter-follower (common collector) amplifier stages without feedback. Both employ complementary-symmetry push-pull amplifier stages.

Cascode operation is a well known technique for reducing distortion in linear gain stages. Cascode amplifiers use two transistor amplifying devices, one a common collector (drain) or common emitter (source) gain device and the other a common base (gate) cascode device. The connection between them is such that the collector (drain) of the first device drives the emitter (source) of the common base (gate) device, which provides a low impedance load and holds the voltage across the first device relative constant. The transistor devices can be either bipolar (with bases, emitters and collectors) or field effect transistors (with gates, sources and drains).

An object of the present invention is to provide a high efficiency cascode transistor power amplifier for high fidelity audio signal amplification with reduced power dissipation.

DISCLOSURE OF THE INVENTION

The above object is met with an amplifier circuit that combines a cascode transistor amplifier configuration having a single or complementary pair of gain transistors biased for Class-A or Class-AB operation with an isolated high impedance current source or sources connected to provide an alternate path for bias current through the gain transistor or transistors other than through the cascode transistors in the cascode configuration. This alternate bias current path provided by the current source or sources, reduces bias current through the cascode transistors and thus reduces energy dissipation that would otherwise occur across the cascode transistors as they hold the voltage drop across the gain transistors relatively constant. Both single ended and complementary embodiments are possible, with a bias voltage across the gates of the complementary gain transistors providing the Class-A or Class-AB operation in the complementary versions, and with a current sink to one of the power supply terminals assuring forward bias in the single-ended version. The cascode configuration can employ either common drain (source-follower) or common source connection of the gain transistor or transistors, and either one or two current sources across one or both gain transistors can be used to provide the alternate bias current path.

BEST MODE OF CARRYING OUT THE INVENTION

Figure 1:
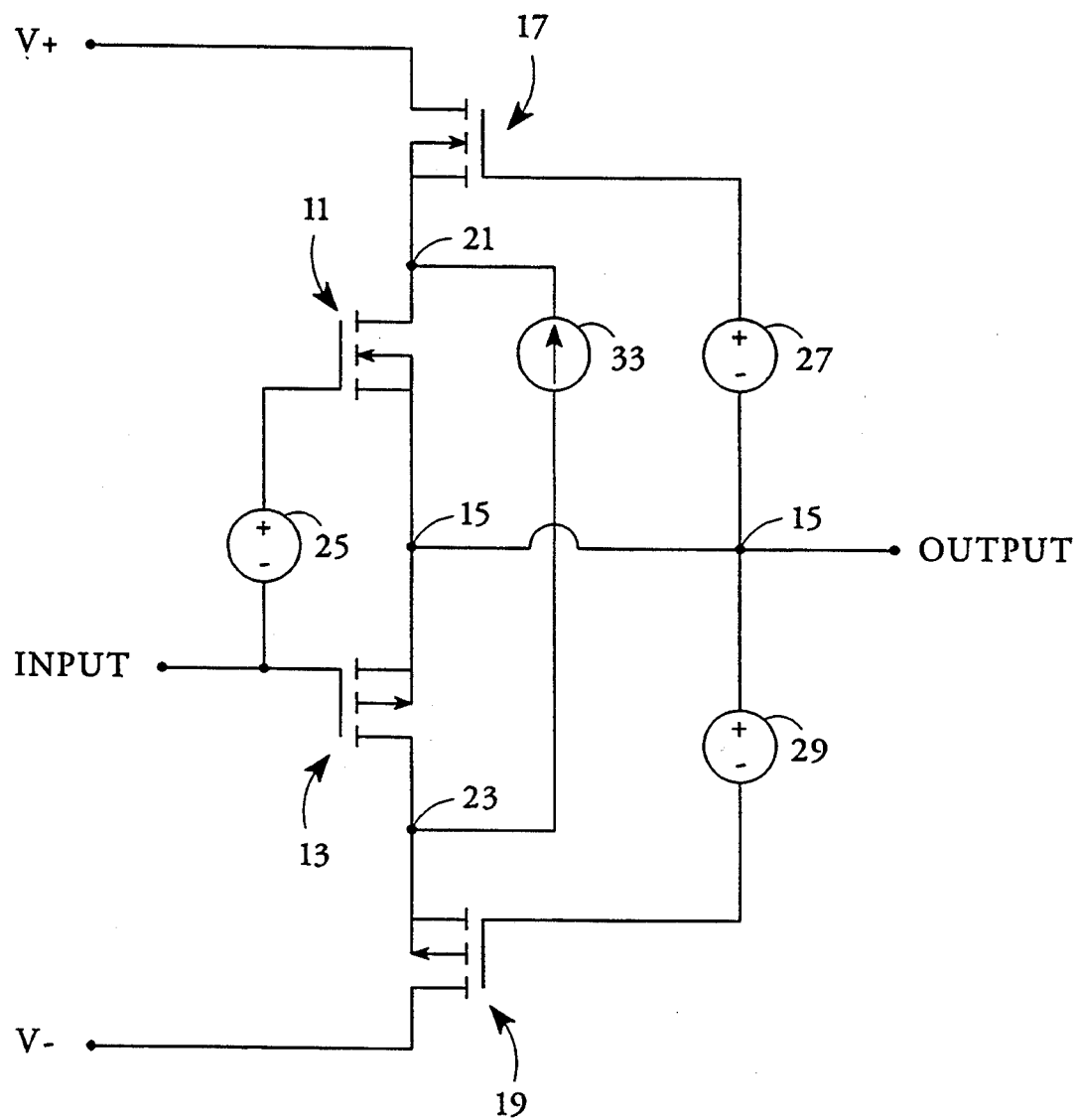
FIG. 1 is a schematic circuit diagram of a power amplifier of the present invention.

With reference to FIG. 1, a cascoded transistor power amplifier with complementary symmetry includes an N-channel MOSFET 11 and a P-channel MOSFET 13 connected together in series with both of their sources coupled to an output node 15. The pair of transistors 11 and 13 provide the output current gain and are cascoded by transistors 17 and 19. The source of N-channel MOSFET 17 is coupled at a node 21 to the drain of N-channel MOSFET 11. Likewise, the source of P-channel MOSFET 19 is coupled at a node 23 to the drain of P-channel MOSFET 13. Power is supplied by voltage sources V+ and V−, which are connected to the drains of transistors 17 and 19, respectively. Gain transistors 11 and 13 are biased into class-A or class-AB operating mode by a voltage source 25 separating their gates. An input signal INPUT is supplied to the gate of gain transistor 13, and the input signal INPUT plus the bias voltage 25 is provided on the gate of gain transistor 11. Cascode transistors 17 and 19 are biased by voltage sources 27 and 29 referenced to the output node 15. This holds the voltages across the gain transistors 11 and 13 relatively constant even as the voltage at the output node 15 between them fluctuates with the input signal INPUT being amplified.

Figure 2:
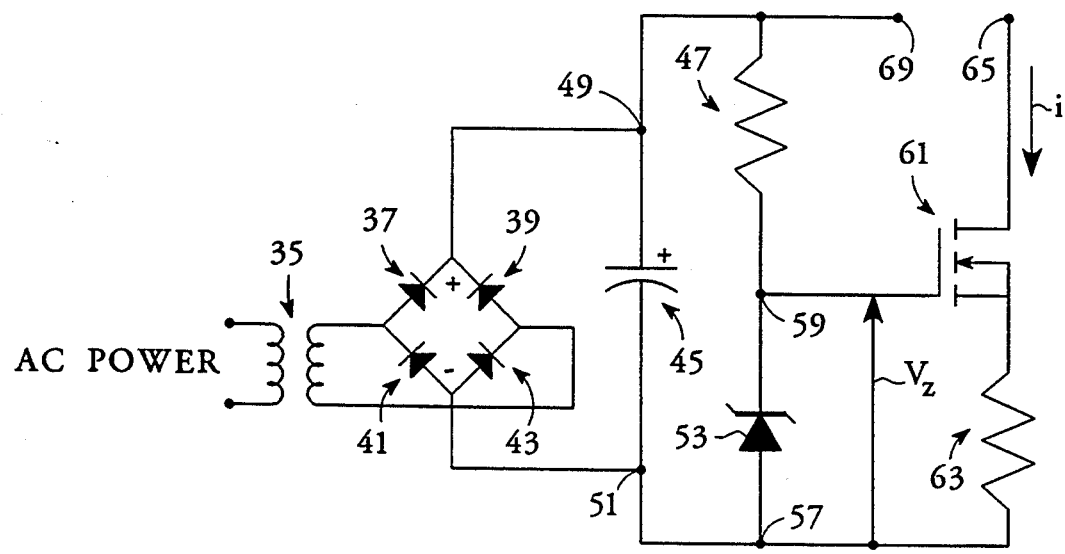
FIG. 2 is a schematic circuit diagram of a constant current source for use in the amplifier of FIG. 1.

An isolated high impedance current source 33 is connected across the drains of gain transistors 11 and 13 at nodes 21 and 23 to provide a bias path for the bias current flowing through transistors 11 and 13, thereby reducing the bias current flowing through the cascode transistors 17 and 19. One such isolated current source 33 is depicted in FIG. 2. The current source is powered by a separate AC power source through a transformer 35 or transformer windings, but, alternatively, could be powered by batteries or some other isolated source. The AC power received from the transformer 35 passes through a full-wave diode bridge rectifier 37–43 then through a capacitor-input filter made up of a filter capacitor 45 and a filter resistor 47 connected across the rectified signal terminals 49 and 51. A diode voltage regulator 53 connected in series with the filter resistor 47 completes a constant voltage source, providing a fixed reference $V_Z$ between the nodes 57 and 59. The voltage available to the current source should be higher than the operating voltage across the gain transistors 11 and 13 of FIG. 1 to be biased, but not so much as to cause excess power dissipation in the current source due to the bias current. An N-channel MOSFET 61 and a resistor 63 are connected in series between an output terminal 65 of the current source and the node 57. The transistor 61 is biased by the reference voltage $V_Z$ at node 59. Thus, the current i that flows between the output terminals 69 and 65 of the current source is given by $i=(V_Z-V_{gs})/R$, where $V_{gs}$ is the gate-to-source voltage of transistor 61 and R is the resistance of the resistor 63. The high source impedance of the current source is provided by the active constant current element 61 and associated components 63 and 53. Alternatively, the high source impedance of the current source could be provided by a resistor.

Returning to FIG. 1, the amplifier circuit combines cascode operation with a current source 33 to operate a common drain power output stage (transistors 11 and 13) with high bias current (for Class-A or highly biased Class-AB operation), but with low energy dissipation. The high voltage power supply V+ and V− is isolated from the gain transistors 11 and 13 by the cascode transistors 17 and 19 which hold the voltage across the gain transistors 11 and 13 at nodes 21 and 23 relatively constant, while the isolated current source 33 provides a separate path for the bias current flowing through transistors 11 and 13 other than through the cascode transistors 17 and 19. Thus, low power dissipation is achieved.

Figure 3:
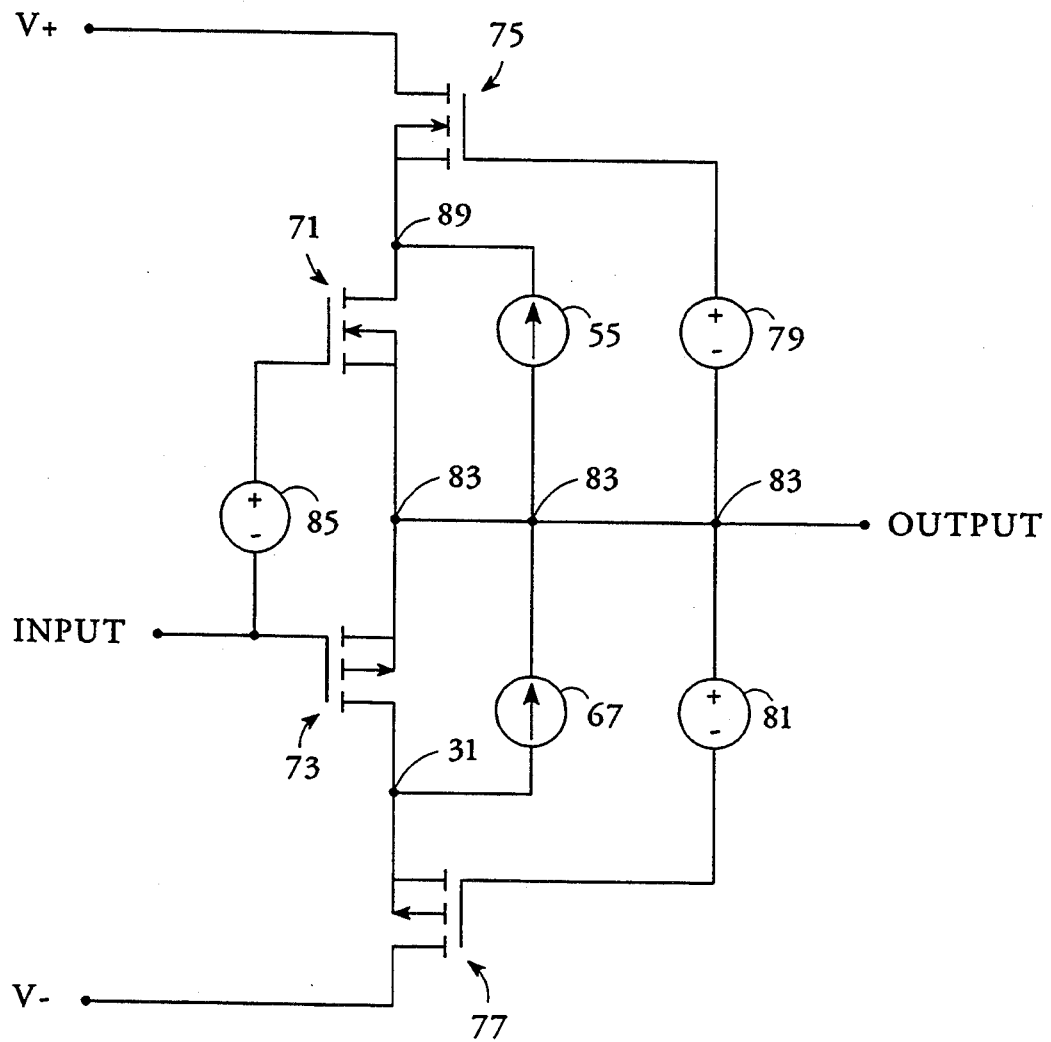
FIG. 3 is a schematic circuit diagram of a second power amplifier embodiment of the present invention.

With reference to FIG. 3, an alternate power amplifier embodiment employs two current sources 55 and 67 instead of just one. Like the embodiment in FIG. 1, this embodiment also has complementary MOSFET gain transistors 71 and 73 which are cascoded by complementary MOSFET transistors 75 and 77. Power is supplied by voltage sources V+ and V− connected to the drains of the cascode transistors 75 and 77, and these transistors 75 and 77 are biased by voltage sources 79 and 81 referenced to the output node 83 so as to hold the voltages across the gain transistors 71 and 73 relatively constant. The gain transistors 71 and 73 are biased into Class-A or Class-AB operation by a voltage source 85 separating their gates, with the input signal applied directly to the gate of transistor 73 and through voltage source 85 to the gate of transistor 71.

The first of the two current sources in FIG. 3, 55, is connected between the output node 83 at the source of gain transistor 71 and the node 89 at the drain of the gain transistor 71 and the source of cascode transistor 75. Current source 55 provides a bias path for the bias current flowing through transistor 71, reducing the bias current flowing through the cascode transistor 75. The second of the two current sources in FIG. 3, 67, is connected between the output node 83 at the source of the gain transistor 73 and the node 31 at the drain of the gain transistor 73 and the source of cascode transistor 77. Current source 67 provides a separate bias path for the bias current flowing through transistor 73, reducing the bias current flowing through the cascode transistor 77. Thus the alternate embodiment in FIG. 3 uses two current sources 55 and 67 that provide separate bias paths for the gain transistors 71 and 73, instead of a single current source that provides only a single bias path for both gain transistors 71 and 73.

Figure 4:
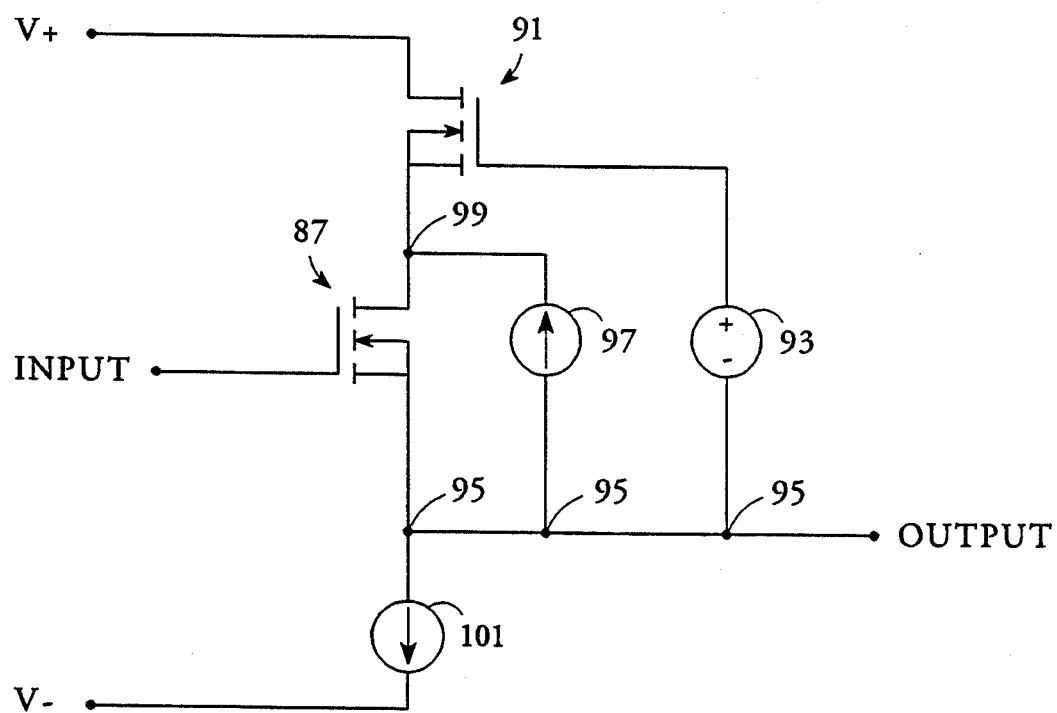
FIG. 4 is a schematic circuit diagram of a third power amplifier embodiment of the present invention.

With reference to FIG. 4, another embodiment of the invention is a single-ended cascode amplifier instead of the complementary-symmetry cascode amplifiers in FIGS. 1 and 2. N-channel MOSFET 87 responsive to an input signal applied to its gate provides the output current gain for the amplifier. Gain transistor 87 is cascoded by the N-channel MOSFET 91 connected so that its source is coupled to the drain of the gain transistor 87. Power is supplied by a voltage source V+ connected to the drain of cascode transistor 91, which is biased by a voltage source 93 referenced to the output node 95 so as to hold the voltage across gain transistor 87 relatively constant. The gain transistor 87 is biased into Class-A or Class-AB operation by the constant current source 101 sinking a bias current to the negative voltage supply V−. An isolated current source 97 is connected between the output node 95 at the source of gain transistor 87 and the node 99 at the drain of transistor 87 (and the source of cascode transistor 91) to provide a bias path for bias current flowing through gain transistor 87 and the current source 101 to the negative voltage supply V−, there-by reducing the bias current flowing through cascode transistor 91.

Figure 5:
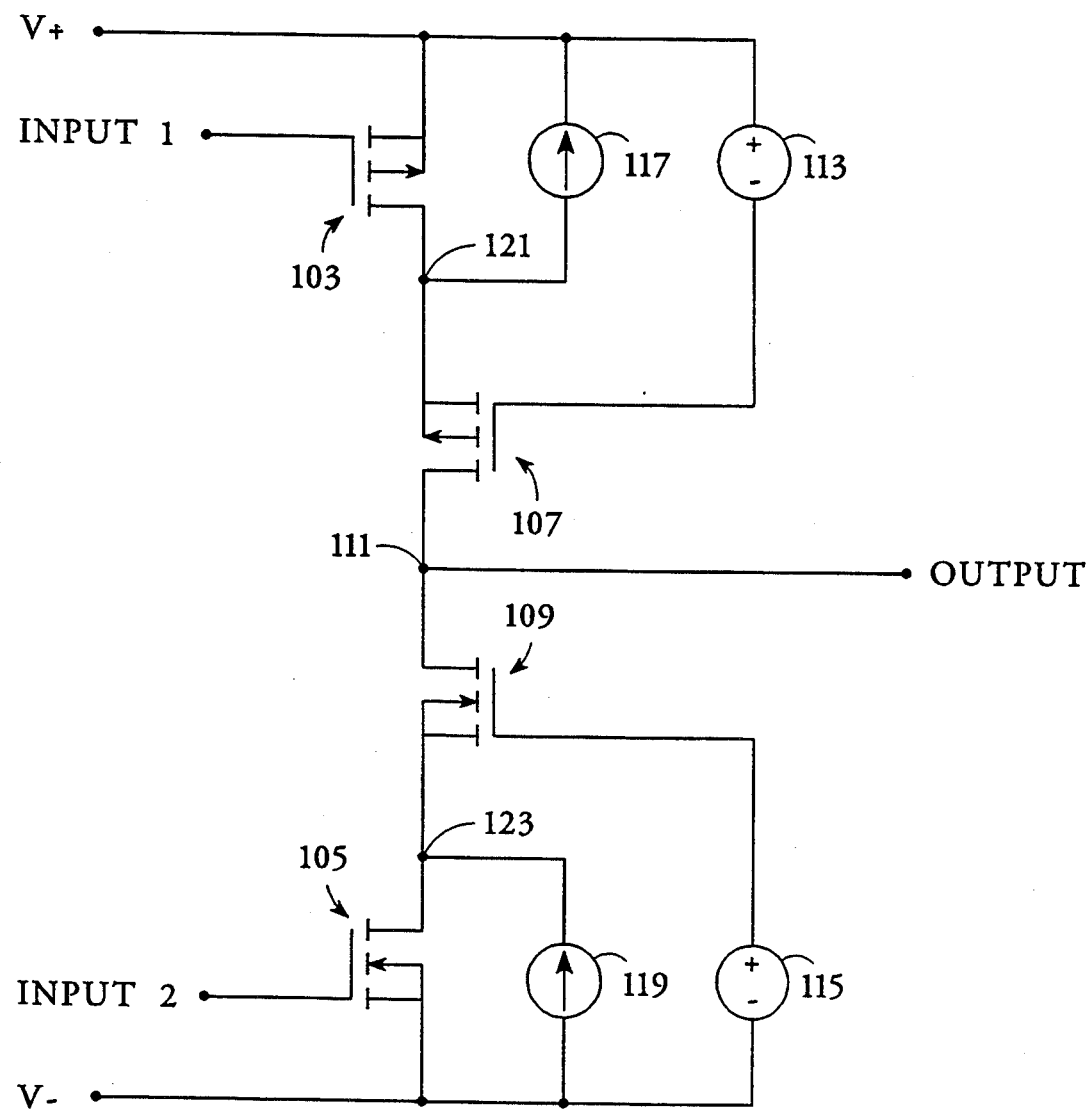
FIG. 5 is a schematic circuit diagram of a fourth power amplifier embodiment of the present invention.

With reference to FIG. 5, a cascode Class-A complementary power amplifier has its gain transistors 103 and 105 configured to operate in a common source mode, instead of the common drain (source-follower) mode of the embodiments in FIGS. 1–4. Power is supplied by voltage sources V+ and V− which are connected to the sources of the P-channel and N-channel gain transistors 103 and 105, respectively. The cascode transistors 107 and 109 are connected between the drains of the respective gain transistors 103 and 105 and an output node 111. Cascode transmitter 107 and 109 are biased by respective voltage sources 113 and 115 referenced to the voltage sources V+ and V−, respectively, to hold the voltages across the gain transistors 103 and 105 relatively constant. The gain transistors 103 and 105 are biased into class-A or class-AB operating mode by input signals INPUT 1 and INPUT 2, respectively, where the first input signal INPUT 1 supplied to the gate of first gain transistor 103 has a voltage that is always greater than the voltage of the second input signal INPUT 2 by a fixed bias voltage VB. This voltage difference can be provided by a bias voltage source, not shown, like the bias voltage sources 25 and 85 in FIGS. 1 and 3, respectively. Isolated current sources 117 and 119 are connected across respective gain transistors 103 and 105 to provide bias paths for the bias current flowing through the gain transistors 103 and 105, thereby reducing the bias current flowing through cascode transistors 107 and 109. Only amplified signal current flows through cascode transistors 107 and 109 to the output node 111. Current source 117 is connected between the positive power source V+ and the node 121 at the drain of gain transistor 103 and the source of cascode transistor 107. Likewise, current source 119 is connected between the negative power source V− and the node 123 at the drain of gain transistor 105 and the source of cascode transistor 109.

I claim:

1. A power amplifier circuit comprising,
 a configuration of transistors including at least one gain transistor and at least one cascode transistor, said gain transistor having a gate coupled to a signal input, said cascode transistor configuration connected across a pair of power supply terminals and having an output terminal,
 means for biasing said gain transistor for Class-A or Class-AB amplifier operation, and
 an isolated high impedance current source connected directly across said gain transistor so as to provide an alternate path for bias current other than through said cascode transistor.

2. The circuit of claim 1 wherein said transistor configuration is a complementary symmetry configuration with a pair of complementary gain transistors and a pair of complementary cascode transistors.

3. The circuit of claim 2 wherein a single current source is coupled across both gain transistors of said complementary pair.

4. The circuit of claim 2 wherein a first current source is coupled across one of said pair of complementary gain transistors and a second current source is coupled across the other of said pair of complementary gain transistors.

5. The circuit of claim 1 wherein said cascode transistor configuration is a single-ended configuration with only one gain transistor and only one cascode transistor, said biasing means being a current sink provided between said gain transistor and one of said power supply terminals.

6. The circuit of claim 1 wherein said gain transistor is connected in a common drain configuration with a drain of said gain transistor coupled through said cascode transistor to one of said power supply terminals, and with a source of said gain transistor connected to said output terminal.

7. The circuit of claim 1 wherein said gain transistor is connected in a common source configuration with a source of said gain transistor connected to one of said power supply terminals, and with a drain of said gain transistor coupled through said cascode transistor to said output terminal.

8. A power amplifier circuit comprising
 a first gain transistor having a gate coupled through a bias voltage source to a signal input, a source connected to an output terminal, and a drain, said first gain transistor being an N-channel MOSFET,
 a second gain transistor having a gate connected to said signal input, a source connected to said output terminal, and a drain, said second gain transistor being a P-channel MOSFET,
 a first cascode transistor having a gate, a source connected to said drain of said first gain transistor, and a drain connected to a first power supply terminal, said first cascode transistor being an N-channel MOSFET,
 a second cascode transistor having a gate, a source connected to said drain of said second gain transistor, and a drain connected to a second power supply terminal, said second cascode transistor being a P-channel MOSFET,
 first and second voltage sources connected between said output terminal and respective gates of said first and second cascode transistors, and
 an isolated high impedance current source connected between said drains of said first and second gain transistors.

9. A power amplifier circuit comprising
 a first gain transistor having a gate coupled through a bias voltage source to a signal input, a source connected to an output terminal, and a drain, said first gain transistor being an N-channel MOSFET,
 a second gain transistor having a gate connected to said signal input, a source connected to said output terminal, and a drain, said second gain transistor being a P-channel MOSFET,
 a first cascode transistor having a gate, a source connected to said drain of said first gain transistor, and a drain connected to a first power supply terminal, said first cascode transistor being an N-channel MOSFET,
 a second cascode transistor having a gate, a source connected to said drain of said second gain transistor, and a drain connected to a second power supply terminal, said second cascode transistor being a P-channel MOSFET,
 first and second voltage sources connected between said output terminal and respective gates of said first and second cascode transistors,
 a first isolated high impedance current source connected between said source and drain of said first gain transistor, and a second isolated high impedance current source connected between said source and drain of said second gain transistor.

10. A power amplifier circuit comprising a gain transistor having a gate connected to a signal input, a source connected to an output terminal, and a drain, said gain transistor being an N-channel MOSFET, a cascode transistor having a gate, a source connected to said drain of said gain transistor, and a drain connected to a first power supply terminal, said cascode transistor being an N-channel MOSFET, a voltage source connected between said output terminal and said gate of said cascode transistor, a current sink connected between said source of said gain transistor and a second power supply terminal, and a current source connected between said source and drain of said gain transistor.

11. A power amplifier circuit comprising a first gain transistor having a gate connected to a first signal input, a source connected to a first power supply terminal, and a drain, said first gain transistor being a P-channel MOSFET, a second gain transistor having a gate connected to a second signal input, a source connected to a second power supply terminal, and a drain, said second gain transistor being an N-channel MOSFET, said first signal input supplying an input signal having a voltage that is greater by a bias voltage than a voltage of an input signal supplied by said second signal input, a first cascode transistor having a gate, a source connected to said drain of said first gain transistor, and a drain connected to an output terminal, said first cascode transistor being a P-channel MOSFET, a second cascode transistor having a gate, a source connected to said drain of said second gain transistor, and a drain connected to said output terminal, said second cascode transistor being an N-channel MOSFET, first and second voltage sources connected between said respective first and second power supply terminals and said respective gates of said first and second cascode transistors, a first isolated high impedance current source connected between said source and drain of said first gain transistor, and a second isolated high impedance current source connected between said source and drain of said second gain transistor.

* * * * *